(12) United States Patent
Knapp et al.

(10) Patent No.: US 6,469,877 B1
(45) Date of Patent: Oct. 22, 2002

(54) SPIN VALVE DEVICE WITH IMPROVED EXCHANGE LAYER DEFINED TRACK WIDTH AND METHOD OF FABRICATION

(75) Inventors: Kenneth E. Knapp, Livermore, CA (US); Ronald A. Barr, Mountain View, CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/335,156

(22) Filed: Jun. 15, 1999

(51) Int. Cl.$^7$ .............................................. G11B 5/127
(52) U.S. Cl. ............................................... 360/324.12
(58) Field of Search ............................. 360/324, 324.1, 360/324.11, 324.12, 126, 121

(56) References Cited

U.S. PATENT DOCUMENTS

| | | |
|---|---|---|
| 4,771,349 A | 9/1988 | Tsang |
| 4,853,080 A | 8/1989 | Anthony |
| 4,967,298 A | 10/1990 | Mowry |
| 5,363,265 A | 11/1994 | Hsie et al. |
| 5,406,433 A | 4/1995 | Smith |
| 5,465,185 A | 11/1995 | Heim et al. |
| 5,493,467 A * | 2/1996 | Cain et al. .................. 360/321 |
| 5,527,726 A | 6/1996 | Possin et al. |
| 5,528,440 A | 6/1996 | Fontana et al. |
| 5,552,949 A | 9/1996 | Hashimoto et al. |
| 5,608,593 A | 3/1997 | Kim et al. |
| 5,637,235 A | 6/1997 | Kim et al. |
| 5,654,128 A | 8/1997 | Hsu |
| 5,658,469 A | 8/1997 | Jennison |
| 5,664,316 A | 9/1997 | Chen et al. |
| 5,667,632 A | 9/1997 | Burton et al. |
| 5,669,133 A | 9/1997 | George |
| 5,680,281 A | 10/1997 | Kung et al. |
| 5,701,221 A | 12/1997 | Taniyama et al. |
| 5,701,223 A | 12/1997 | Fontana, Jr. et al. |
| 5,721,008 A | 2/1998 | Huang et al. |
| 5,828,531 A * | 10/1998 | Gill ........................ 360/324.12 |
| 6,128,167 A * | 10/2000 | Saito et al. ............. 360/324.12 |
| 6,144,524 A * | 11/2000 | Haratani et al. ........ 360/324.12 |
| 6,175,476 B1 * | 1/2001 | Huai et al. .............. 360/324.11 |
| 6,181,533 B1 * | 1/2001 | Pokhil .................... 360/324.11 |
| 6,181,534 B1 * | 1/2001 | Gill ........................ 360/324.11 |
| 6,185,077 B1 * | 2/2001 | Tong et al. .................. 360/317 |
| 6,295,187 B1 * | 9/2001 | Pinarbasi ............... 360/324.11 |
| 6,327,121 B1 * | 12/2001 | Nagasawa et al. ...... 360/324.11 |
| 6,396,668 B1 * | 5/2002 | Mao et al. ................... 360/314 |

\* cited by examiner

*Primary Examiner*—Allen Cao
(74) *Attorney, Agent, or Firm*—Carr & Ferrell LLP

(57) ABSTRACT

The present invention provides an exchange break to define the track width of a read head by selectively isolating an exchange coupling layer from an underlying ferromagnetic layer. In the preferred embodiment, the exchange break is provided over a portion of the free layer of a spin valve device so that it inhibits exchange coupling between an overlying portion of the exchange coupling layer and the underlying free layer to define an active region. It is preferred to form the exchange break of an electrically insulating material, to inhibit current shunting through the exchange break, and of a material that easily etches, to minimize inadvertent etching of the underlying free layer and to ensure complete removal of exchange break material when forming the exchange break from an exchange break layer. A reentrant profile photoresist structure may be used to define the exchange break and to define the exchange coupling layer. Drift portions of the exchange coupling layer, which typically form under the overhang of the photoresist and blur delineation of the active region, are separated from the underlying free layer by the exchange break, so that variations in thickness and in shifted material composition do not blur active region delineation. Because the width of the active region is defined by the exchange break, the present invention decouples the track width of the device from the geometry of the exchange coupling layer.

34 Claims, 3 Drawing Sheets

SPIN VALVE DEVICE WITH IMPROVED EXCHANGE LAYER DEFINED TRACK WIDTH AND METHOD OF FABRICATION

BACKGROUND

Spin valve sensors exploit changes in electrical resistance which occurs as a result of manipulating the relative orientation of the magnetization of ferromagnetic layers within a spin valve sensor. In conventional spin valve sensors, one ferromagnetic layer has its magnetization pinned while another, which has its magnetization set perpendicular to the pinned layer, is free to change its magnetic orientation in response to magnetized bits on an adjacent recording media. The magnetized bits on the recoding media, therefore, change the relative magnetization between the pinned layer and the free layer. An induced current through the spin valve is used to detect changes in the resistance of the spin valve that results from changes in the relative magnetization of the pinned and free layers.

The conventional spin valve utilizes an antiferromagnetic pinning layer adjacent the pinned layer to pin the direction of the magnetization of the pinned layer by exchange coupling. The free layer, which may be made of several layers, is separated from the pinned layer by a thin nonmagnetic metallic layer. The magnetic orientation of the free layer is aligned so that it is free to rotate in an active region.

The orientation of the free layer may set by an abutting biasing region as shown in U.S. Pat. No. 5,528,440, by Fontana et al., entitled SPIN VALVE MAGNETORESISTIVE ELEMENT WITH LONGITUDINAL EXCHANGE BIASING OF END REGIONS ABUTTING THE FREE LAYER AND MAGNETIC RECORDING SYSTEM USING THE ELEMENT, issued Jun. 18, 1996, herein incorporated by reference in its entirety. Although such a structure allows the magnetic orientation of the free layer located between the abutting biasing regions to rotate, its structure is not easily fabricated at smaller geometries.

Smaller geometries are required to improve data density on the storage device. One way to improve data density is to reduce the track width of the data on the media. Reduced track width on the media requires a reduced track width reader to prevent inadvertent sensing of adjacent tracks or of other stray magnetic flux. Thus, as track width decreases, a smaller active region is necessary. Furthermore, as the active region becomes smaller, it is more critical that it have clearly defined boundaries. Therefore, a clearly defined active region is necessary for fabricating small read heads.

SUMMARY OF THE INVENTION

The present invention provides an exchange break to define the track width of the read head by selectively isolating an exchange coupling layer from an underlying ferromagnetic layer.

In the preferred embodiment, the exchange break is provided over a portion of the free layer of a spin valve device so that it inhibits exchange coupling between an overlying portion of the exchange coupling layer and the underlying free layer. The exchange break thus defines an active region of the free layer under the exchange break.

Although in some embodiments it is possible to form the exchange break of electrically conductive material, it is preferred to form the exchange break of an electrically insulating material to inhibit current shunting through the exchange break. The exchange break is preferably formed by depositing and etching an exchange break layer. As such, it also is preferred to form the exchange break layer of a material that is easily etched to minimize inadvertent etching of the underlying free layer and to ensure complete removal of the etched portion of the exchange break material layer.

It is possible to use a reentrant profile photoresist structure to define the exchange break. The exchange break may be formed under the photoresist structure with its edges generally aligned with the overhang portion of the reentrant photoresist structure. The exchange coupling layer then may be deposited typically forming drift portions under the overhang of the reentrant photoresist structure.

The drift portions often taper off and have a shifted material composition. These variations in thickness and material composition can degrade exchange coupling, blurring delineation of the active region of the free layer. The exchange break inhibits the drift portions from coupling with the underlying ferromagnetic material of the free layer, thus clearly defining the active region in this embodiment.

With some embodiments, a small amount of free layer material may be deposited just prior to exchange coupling layer deposition to establish good exchange coupling between the free and exchange coupling layers.

Because the width of the active region is defined by the exchange break, the present invention decouples the track width of the device from the geometry of the exchange coupling layer.

DETAILED DESCRIPTION OF THE PREFERRED EMBODIMENTS AND METHODS OF THE INVENTION

Figure 1:
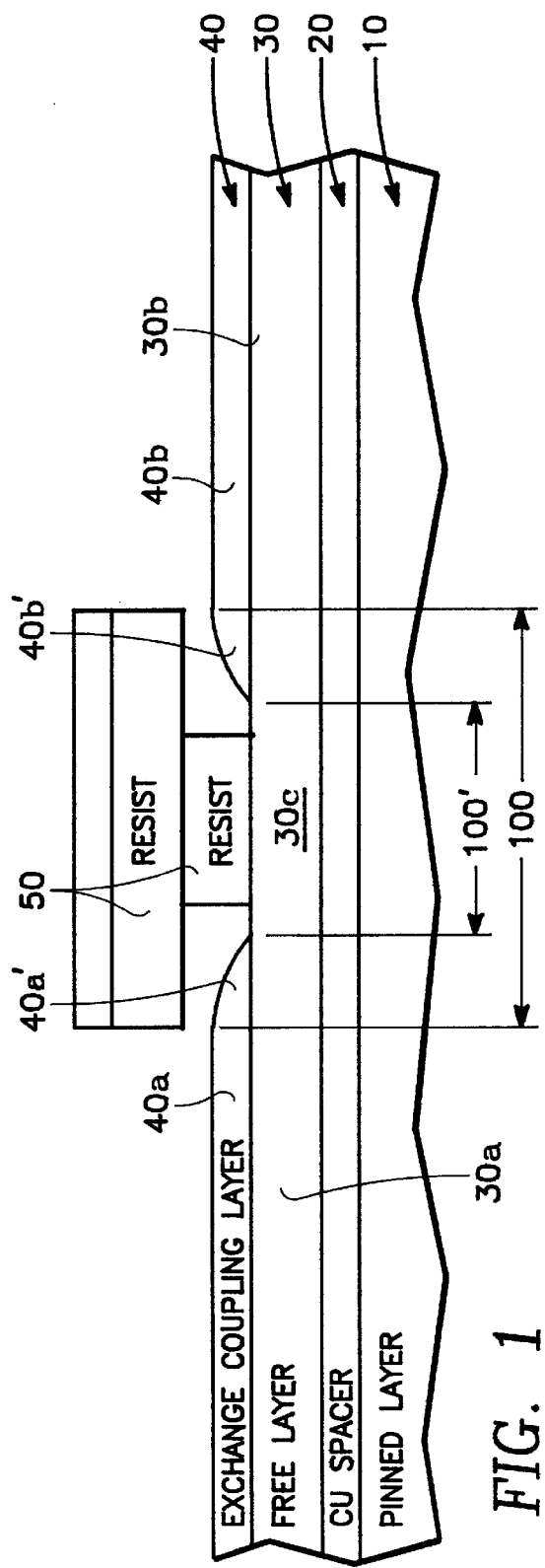
FIG. 1 is a view of the air bearing surface of a partially fabricated spin valve type sensor without a exchange break.

Turning to FIG. 1, one way to bias the free layer 30 so that the active region 30c is able to rotate in the presence of the magnetic bits of a storage media is to deposit an exchange coupling layer 40 on the free layer 30, lateral to the active region 30c. The lateral portions 30a & 30b of the free layer, which have their magnetic orientation aligned by exchange coupling of the overlying exchange coupling layer 40a & 40b, will in turn align the active region 30c so that it is free to rotate in the presence of the magnetic bits on the media. The lateral portions 40a & 40b of the exchange coupling layer, thus define the width 100 of the active region of 30c, and therefore the track width of the spin valve device.

One way to define a small active region 30c is to use a reentrant photoresist lift off method. A reentrant photoresist structure 50 is formed on the free layer 30 as is known in the art. The reentrant photoresist structure 50 may be a bilayer structure, as shown in FIG. 1, or a tapered edge structure as is known in the art. The exchange coupling material is deposited over the exposed free layer 30 and the reentrant photoresist structure 50. The reentrant photoresist 50 defines the active region 30c and is later removed along with any material thereon. One drawback with this approach is that the exchange coupling layer 40 drifts near the reentrant resist structure 50. The drifting of the exchange coupling layer 40 blurs the boundary of the active region 30c of the free layer 30. It not only causes a change in thickness of the exchange coupling layer as it drifts, it also causes a shifting of the composition of the exchange coupling layer 40 near the reentrant structure 50.

As the exchange coupling layer is deposited, it drifts under the overhanging resist structure 50 forming tapered edge portions 40a' & 40b'. The exchange coupling layer 40 typically is formed with a thickness of about 100 Å to 400 Å to provide exchange coupling with the free layer 30, as is well know in the art. The exchange coupling layer 40, however, gradually thins near the edge 40a' & 40b'. As it thins, the minimum thickness required for exchange coupling between the layers is reached and the exchange coupling layer 40 is no longer able to exchange couple with the underlying free layer 30a & 30b. Thus, the width of the active region 30c lies somewhere between 100 & 100', but is not clearly defined.

To compound this, empirical data has shown that the material composition of the exchange coupling layer 40 shifts near and in the edge portions 40a' & 40b'. For example, in a Mn based antiferromagnetic exchange coupling layer, such as in a FeMn, IrMn, NiMn, PtMn, PtPdMn, or other Mn based antiferromagnetic material, more Mn tends to deposit in and near the edge portions 40a' & 40b' than do the other elements of the antiferromagnetic layer. This changes the properties of the coupling layer in and near the edge portions 40a' & 40b' so that the exchange coupling layer becomes less effective in coupling the underlying free layer 30a & 30b in this area. Furthermore, depending on the deposition technology used, such changes in properties may extend out into the exchange layer 40a & 40b from the edge of the resist structure 50. This change in material composition further blurs the boundary of the active region. Undesirable changes in composition near the vicinity of edge are present even with conventional straight profile photoresist structures.

One possible solution is to define the active region track using a uniform deposition and etch process. Etching the exchange coupling layer, however, is difficult to precisely control without etching into the underlying free layer 30. This is because the thickness of the exchange coupling layer 40 is usually only from about 5 Å to 50 Å thick. Etching into the underlying free layer can cause variations in the thickness of the free layer, thus creating a device performance problem.

Figure 2:
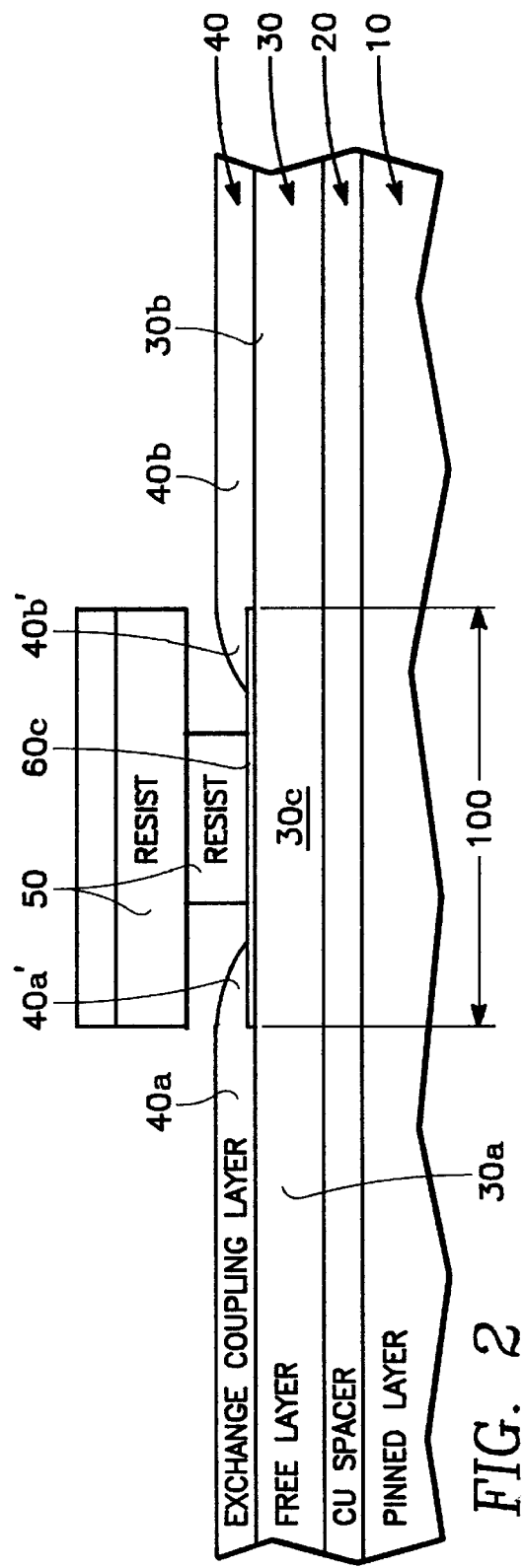
FIG. 2 is a view of the air bearing surface of a partially fabricated spin valve type sensor with an exchange break.

Turning to FIG. 2, in the preferred embodiment of the present invention, an exchange break 60c is formed on the free layer 30 prior to depositing the exchange coupling layer 40. The exchange break 60c serves to decouple the exchange coupling layer 40 and the free layer 30 so as to clearly define the active region 30c of the free layer 30.

The exchange break 60c may be made of any material and of sufficient thickness to prevent exchange coupling between the exchange layer 40 and the free layer 30. In the preferred embodiment, the exchange break is formed of an easily etched dielectric material, such as for example SiN, SiO$_2$, Al$_2$O$_3$, Ta, or the like. Although it also is possible to form the exchange break 60c of a metallic material, it is presently preferred, with the embodiment of FIG. 2, to use an electrically insulative material. This inhibits current shunting through the exchange break 60c. In the case of the spin valve, reducing shunting of the sensing current improves its performance.

Figure 3:
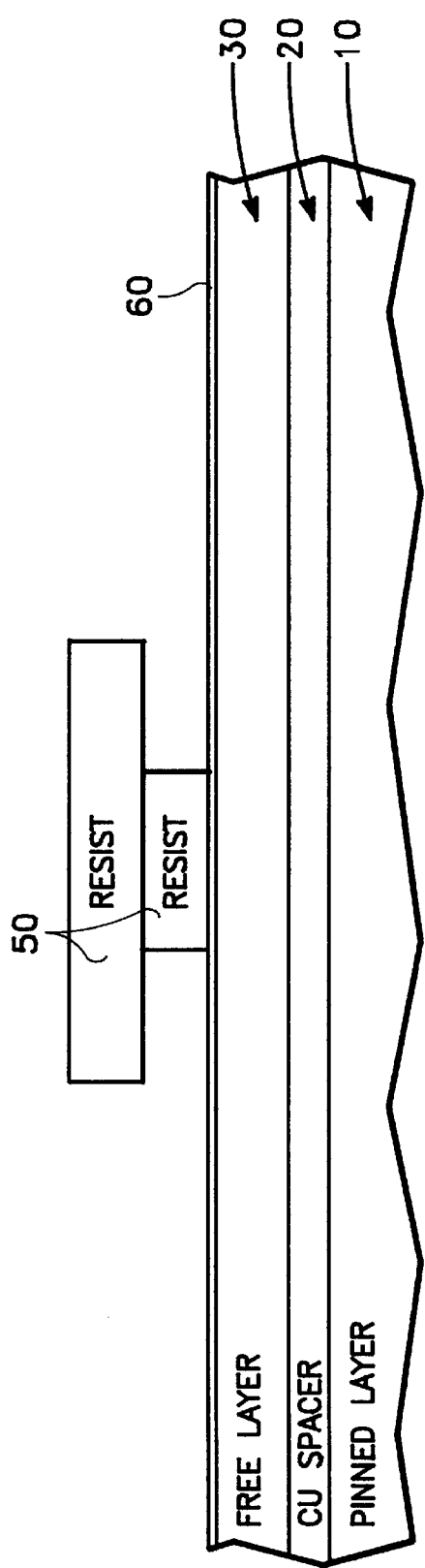
FIG. 3 is a view of the air bearing surface of a partially fabricated spin valve type sensor depicting a step in exchange break fabrication.
Figure 4:
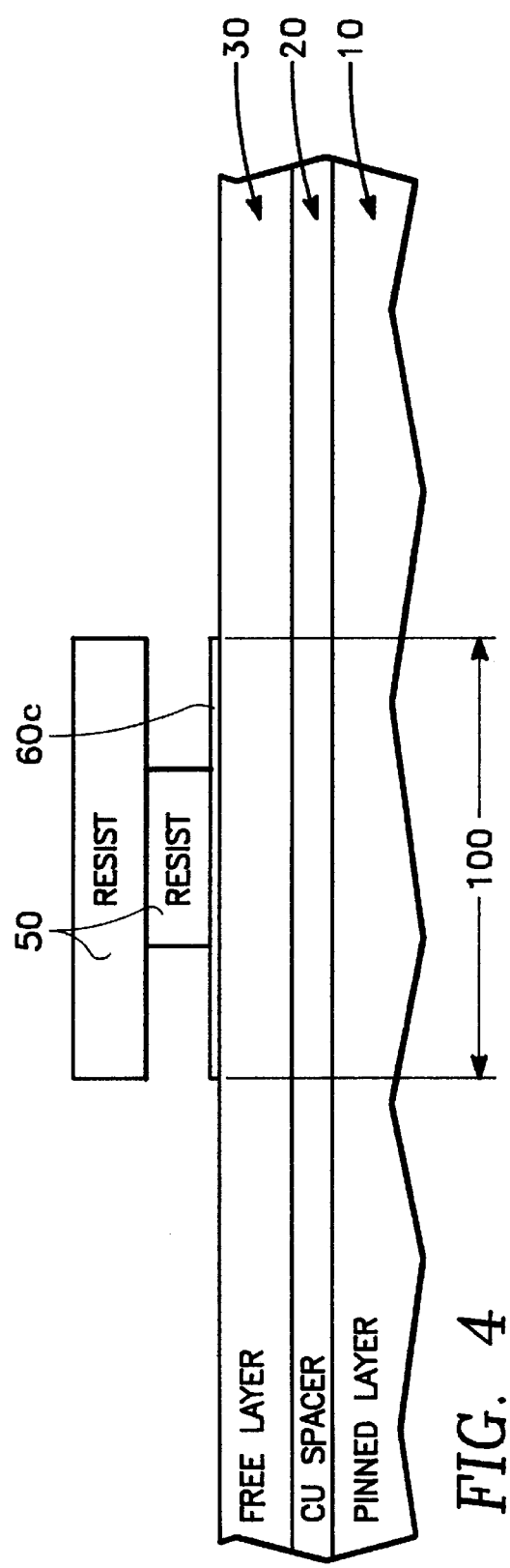
FIG. 4 is a view of the air bearing surface of a partially fabricated spin valve type sensor depicting a step in exchange break fabrication.

In addition, with the preferred method of fabrication, the exchange break 60c is formed by depositing and etching an exchange break layer 60, as shown in FIGS. 3 & 4. As such, it is preferred to form the exchange break layer 60 of an easily etched material, one that has a high degree of selectivity as compared to the underlying free layer 30, such as SiN, SiO2, Al2O3, Ta, or other known material with high etch selectivity. This prevents inadvertent etching of the free layer 30 when defining the exchange break 60c.

Because residue may form on the surface of the free layer from exchange break layer etching, from resist structure formation, or from exposure to air, in the preferred method of fabrication, a small amount of free layer material is deposited just prior to forming the exchange coupling layer 40, without allowing air into the processing chamber before depositing the exchange coupling layer 40. Deposition in this manner ensures good coupling between the exchange and free layers 40 & 30. In the preferred method, the exchange layer is deposited without breaking vacuum after the small amount of free layer material has been deposited to inhibit native oxides from forming on the surface of the free layer material. The newly deposited portion of the free layer couples more easily to the previously deposited free layer in the presence of residues than does the exchange layer. As such, exchange pinning between the free and exchange layers is improved.

Although the exchange break layer may be defined using any known process, it is preferred to define the exchange break 60c using the bilayer reentrant structure 50 to define the width 100 of the exchange break 60c. As such, it is preferred that the exchange break 60c be formed so that its edges approximately are aligned with the overhang of the reentrant photoresist structure 50. This allows the exchange coupling layer 40 to be deposited so that the edge portions 40a' & 40b' extend onto the exchange break 60c without having to remove the photoresist structure 50 after exchange break 60c formation. The exchange break 60c breaks the exchange coupling between the edge portions 40a' & 40b' and the underlying free layer 30 to more clear delineate the passive and active regions, 30a&b and 30c respectively.

The exchange coupling layer 40, no longer is able to exchange couple to the active region 30c of the free layer 30 under the drift portions 40a' & 40b' of the exchange coupling layer 40. Hence, the exchange pinning of the exchange coupling layer has a sharp cut off rather than a roll off to define the width 100 of the active region 30c, thus providing a means to clearly define the track width of the device.

The exchange break of the present invention defines the width of the active region, and thus the track width, by selectively isolating the exchange coupling layer from the underlying ferromagnetic layer. It decouples the width of the active region from the geometry of the exchange coupling layer, thus allowing for smaller more well defined track widths.

Figure 5:
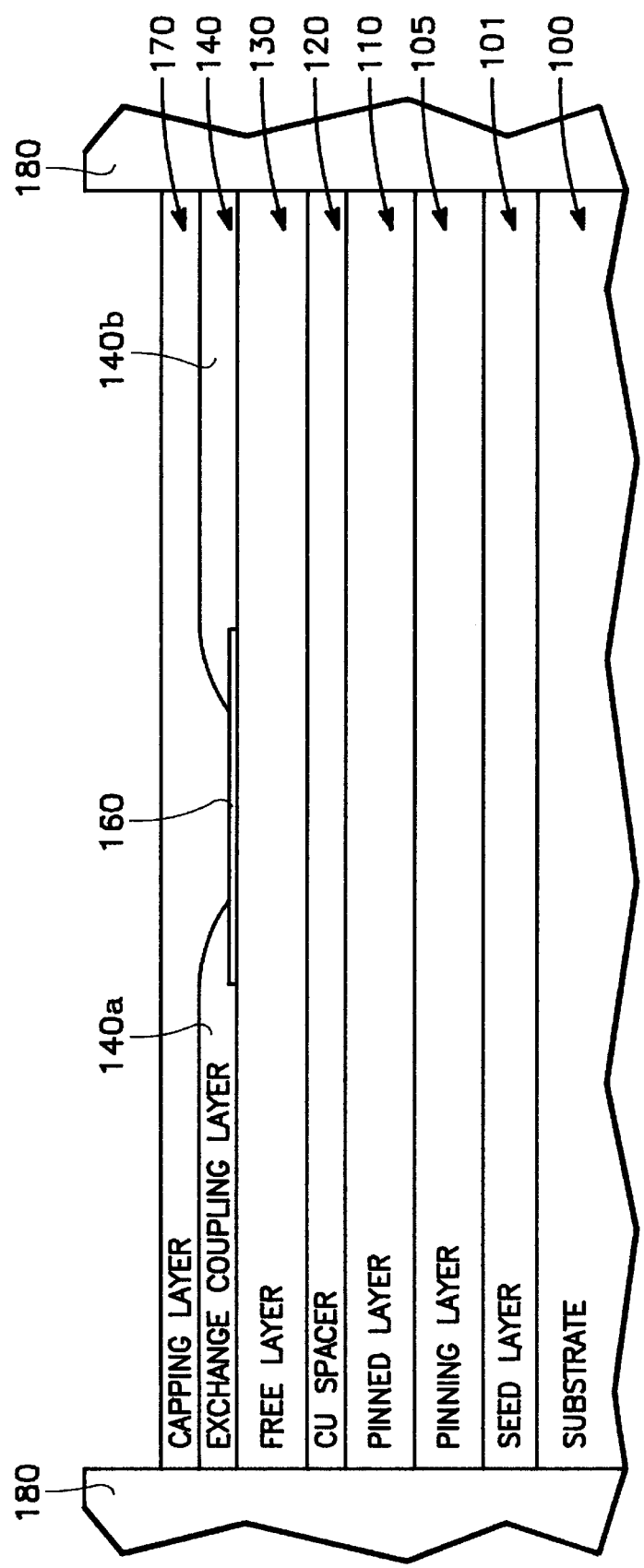
FIG. 5 is a view of the air bearing surface of an embodiment of a spin valve type sensor in accordance with the present invention.

Turning to FIG. 5, the present invention may be have any structure known in the art. FIG. 5 depicts a possible embodiment of a spin valve device in accordance with the present invention. It should be noted, that in the embodiment of FIG. 5, it is preferred to form the exchange coupling layer 140 of electrically isolated portions 140a and 140b to inhibit current shunting through the exchange coupling layer 140.

With this embodiment, the spin valve may be deposited over a previously formed write head, or may be formed on a substrate 100. Embodiments of the spin valve made in accordance with the present invention may comprise: a substrate 100, a seed layer 101, an antiferromagnetic pinning layer 105, pinned layer 110, a spacer layer 120, a free layer or layers 130, an exchange break 160, a free layer exchange coupling layer 140, a capping layer 170, and contacts 180. The spin valve of the present invention may be fabricated using material and techniques well known in the art.

By way of non-exclusive example, and, in addition to other known materials and fabrication techniques, in one embodiment: the substrate 100 may be silicon; the seed and capping layers 101 & 170 may be formed of Ta; the pinning layer 105 may be an antiferromagnetic material such as FeMn, IrMn, NiMn, PtMn, PtPdMn, or any other Mn based antiferromagnetic material, or NiO, NiCoO, or the like, or any other known antiferromagnetic material; the pinned layer 110 may be Co, Ni, Fe, or their alloys; the spacer layer 120 may be Cu or other conductor, the free layer 130 may be Co, Ni, Fe, or their alloys; the exchange break layer 160 is formed as discussed above; the exchange coupling layer 140 may be formed of any known antiferromagnetic material, and in a manner, as discussed above; and the leads 180 may be Cu or other conductor material.

Furthermore, embodiments of the present invention may have a top spin valve, bottom spin valve, or dual spin valve structure. In addition, embodiments of the read head may have other structures such as the ones disclosed in U.S. Pat. No. 5,701,223, by Fontana, Jr. et al., issued on Dec. 23, 1997, entitled SPIN VALVE MANETORESISTIVE SENSOR WITH ANTIPARALLEL PINNED LAYER AND IMPROVED EXCHANGE BIAS LAYER, AND MAGNETIC RECORDING SYSTEM USING THE SENSOR, and in U.S. Pat. No. 5,465,185, by Heim, et al., issued on Nov. 7, 1995, entitled MAGNETORESISTIVE SPIN VALVE SENSOR WITH IMPROVED PINNED FERROMAGNETIC LAYER AND MAGNETIC RECORDING SYSTEM USING THE SENSOR, both herein incorporated by reference in their entireties.

While the preferred embodiments of the present invention have been described in detail above, many changes to these embodiments may be made without departing from the true scope and teachings of the present invention. The present invention, therefore, is limited only as claimed below and the equivalents thereof.

What we claim is:

1. A spin valve sensor comprising:
    a) a pinned layer;
    b) a free layer;
    c) an exchange coupling layer overlying the free layer so as be capable of biasing the free layer by exchange coupling; and
    d) an exchange break overlying a portion of the free layer to inhibit coupling between a portion of the overlaying exchange layer and the free layer so as to define an active region of the free layer.

2. The spin valve sensor of claim 1 wherein the exchange layer further comprises drift portions, and wherein the exchange break inhibits exchange coupling between the drift portions and the free layer.

3. The spin valve sensor of claim 1 wherein the exchange break comprises a dielectric material.

4. The spin valve sensor of claim 1 wherein the exchange break comprises a metallic material.

5. The spin valve sensor of claim 1 wherein the exchange break is formed of a material with high etch selectivity.

6. The spin valve sensor of claim 1 wherein the exchange break layer consists essentially of silicon nitride.

7. The spin valve sensor of claim 1 wherein the free layer comprises a first portion deposited prior to formation of the exchange break and a second portion deposited after the exchange break formation.

8. The spin valve sensor of claim 7 wherein the exchange coupling layer is formed on the second portion of the free layer.

9. The spin valve sensor of claim 8 wherein the second portion of the free layer and the exchange coupling layer are formed without breaking vacuum between formation of the second portion of the free layer and the exchange coupling layer.

10. The spin valve sensor of claim 1 wherein the exchange coupling layer is formed adjacent the free layer such that oxides are inhibited from forming between exchange coupling layer and the adjacent free layer.

11. The spin valve sensor of claim 1 further comprising lead material abutting the free layer, the pinned layer, and a spacer layer.

12. The spin valve sensor of claim 11, wherein the leads comprise Cu.

13. The spin valve sensor of claim 1 wherein the exchange coupling layer is formed by a reentrant photoresist liftoff process.

14. A spin valve sensor comprising:
    a pinned layer;
    a free layer above the pinned layer;
    an exchange break above a portion of the free layer; and
    an exchange coupling layer above the free layer and above a portion of the exchange break.

15. The spin valve sensor of claim 1, wherein the exchange break comprises SiN, $SiO_2$, $Al_2O_3$, or Ta.

16. The spin valve sensor of claim 1, wherein the pinning layer comprises an antiferromagnetic material.

17. The spin valve sensor of claim 16, wherein the antiferromagnetic material is Mn based.

18. The spin valve sensor of claim 16, wherein the antiferromagnetic material comprises FeMn, IrMn, NiMn, PtMn, PtPdMn, NiO, NiCoO.

19. The spin valve sensor of claim 1, wherein the pinned layer comprises Co, Ni, Fe, or an alloy thereof.

20. The spin valve sensor of claim 1, wherein the spacer layer comprises a conductive material.

21. The spin valve sensor of claim 20, wherein the spacer layer comprises Cu.

22. The spin valve sensor of claim 1, wherein the free layer comprises Co, Ni, Fe, or an alloy thereof.

23. The spin valve sensor of claim 1, wherein the exchange coupling layer comprises an antiferromagnetic material.

24. The spin valve sensor of claim 1 further comprising a seed layer wherein the pinning layer is between seed layer and the pinned layer.

25. The spin valve sensor of claim 24, wherein the seed layer comprises Ta.

26. The spin valve sensor of claim 1 further comprising a capping layer overlying the exchange break.

27. The spin valve sensor of claim 26 wherein the capping layer further overlies the exchange coupling layer.

28. The spin valve sensor of claim 26, wherein the capping layer comprises Ta.

29. A spin valve sensor comprising:
    a pinned layer;
    a free layer including an active region over the pinned layer;

an exchange coupling layer over the free layer capable of biasing the free layer by exchange coupling and including tapered end portions defining therebetween an opening over the active region.

30. The spin valve sensor of claim 29, wherein the tapered end portions have a thickness less than a minimum thickness required for exchange coupling with the free layer.

31. The spin valve sensor of claim 30, wherein the opening has a width less than a width of the active region.

32. The spin valve sensor of claim 29, wherein the exchange coupling layer has a thickness of about 100 Å to 400 Å outside of the tapered end portions.

33. The spin valve sensor of claim 29, wherein the exchange coupling layer comprises a Mn based antiferromagnetic material.

34. The spin valve sensor of claim 33, wherein the concentration Mn in the exchange coupling layer increases in the end portions.

* * * * *